United States Patent [19]

Lin

[11] Patent Number: 5,383,759

[45] Date of Patent: Jan. 24, 1995

[54] LOW PARTICLE WAFER AUTOMATIC FLAT ALIGNER

[76] Inventor: Gaille Lin, 1515 Flintwood Dr., Dallas, Tex. 75081

[21] Appl. No.: 109,514

[22] Filed: Aug. 20, 1993

[51] Int. Cl.⁶ .............................................. B65G 47/24
[52] U.S. Cl. .................................. 414/257; 198/394; 414/433; 414/936; 414/786
[58] Field of Search .................. 414/757, 936; 198/394

[56] References Cited

U.S. PATENT DOCUMENTS

| 4,662,811 | 5/1987 | Hayden | 414/757 X |
| 5,028,200 | 7/1991 | Shimane | 414/936 X |

Primary Examiner—Michael S. Huppert
Assistant Examiner—Janice L. Krizek
Attorney, Agent, or Firm—John E. Vandigriff

[57] ABSTRACT

Disclosed is an apparatus and method for aligning the flat edges of semiconductor wafers in a wafer cassette. The apparatus includes a roller and alignment blade mounted in a frame on which the wafer cassette is mounted. A motor mechanism rotates the roller and alignment blade to align the wafer flat edges.

17 Claims, 6 Drawing Sheets

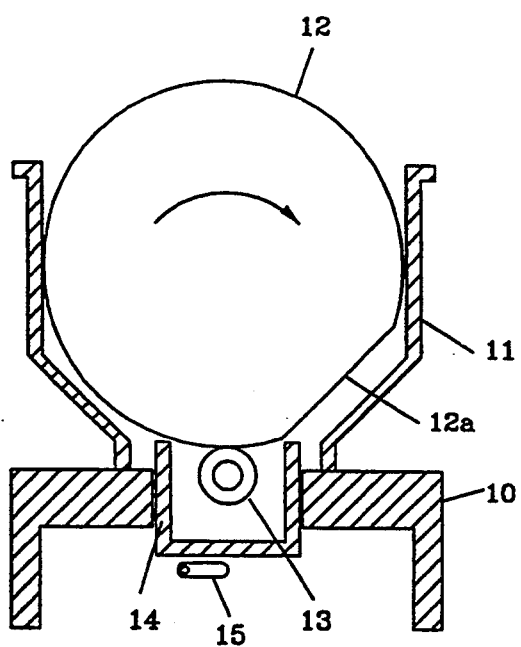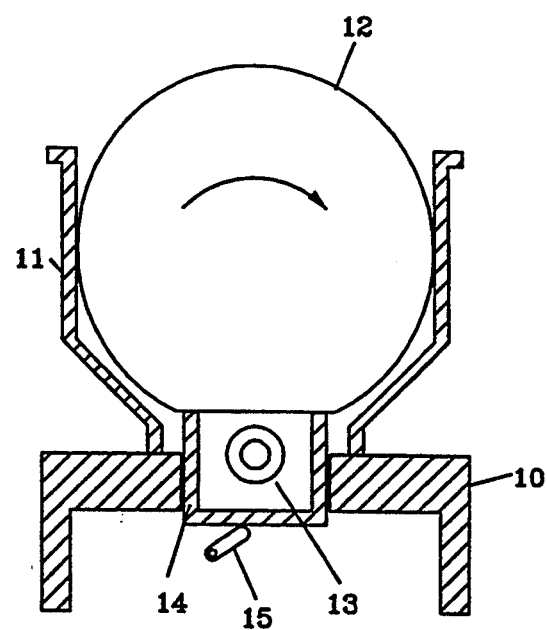
FIGURE 1
Prior Art
FIGURE 2
Prior Art

LOW PARTICLE WAFER AUTOMATIC FLAT ALIGNER

FIELD OF THE INVENTION

The invention relates to an apparatus and method for aligning semiconductor wafers, and more particularly to an automated apparatus and method for aligning the flat edge of semiconductor wafers while minimizing wafer contamination from micro particles.

BACKGROUND OF THE INVENTION

During the processing of semiconductor wafers it is necessary to maintain proper orientation of the wafer during the many processing steps. Wafers are generally stored in wafer cassettes and are transported between processing stations in the cassettes. The cassettes are placed in the processing station and the wafers are removed by machine automated wafer handlers. The wafer handlers to not orient the wafers, but merely move them from the cassette to a processing station and back to the cassette. Therefore, it is necessary for the wafers to be properly aligned in the cassettes.

Some conventional wafer flat alignment apparatus have a wafer rotating drive roller with a diameter which is usually greater than one inch. The roller is covered with a sleeve made from polyurethane or silicone rubber. The alignment apparatus also has a vertical motion alignment plate and a vertical motion bearing plate, both of which are guided with linear guides. The plates generate micro particles as they move up and down. The drive roller surface tends to slip between the wafers and the roller surface, which motion tends to produce micro particles. Portions of the particles fall off the roller and become a source of wafer surface contamination. Particles remaining on the roller make the roller slippery. The area of the aligner beneath the wafers includes mechanisms that prevent the laminar flow of air to pass through the aligner. Particles that are generated during wafer rotation and alignment are blown upward, and some of the particles settle on the wafer surface causing defects. The micro particles are invisible to the eye and are a major clean room contaminator.

BRIEF SUMMARY OF THE INVENTION

The invention is to a low particle, wafer flat alignment apparatus, and to the method of operation. The apparatus is suitable for sub-micron wafer fabrication process clean rooms.

The apparatus includes a frame on which a wafer cassette is placed. One end of the frame is the control apparatus for automatically aligning the flat edges of the wafers. The wafer cassette is placed on the frame, a switch is actuated that begins the alignment procedure.

A small drive roller is centered under the mounted cassette and turns to rotate the wafers. A pivot action blade stops and positions the wafers such that the flat edges align along the pivot blade.

The positioning of the wafer flat edges is determined by the number of turns of the roller. The diameter of the roller is related to the diameter of the wafers being aligned.

The method includes, based upon provided information, how the wafer flat is to be aligned. The flat edges may be aligned at the bottom of the cassette, or at the top of the cassette. Two other alignment positions may be programmed.

The technical advance represented by the invention, as well as the objects, thereof will become apparent from the following description of a preferred embodiment of the invention when considered in conjunction with the accompanying drawings, and the novel features set forth in the appended claims.

BRIEF DESCRIPTION OF THE DRAWINGS

FIGS. 1 and 2 illustrate a prior art wafer alignment apparatus;

DESCRIPTION OF A PREFERRED EMBODIMENT

Figure 3:
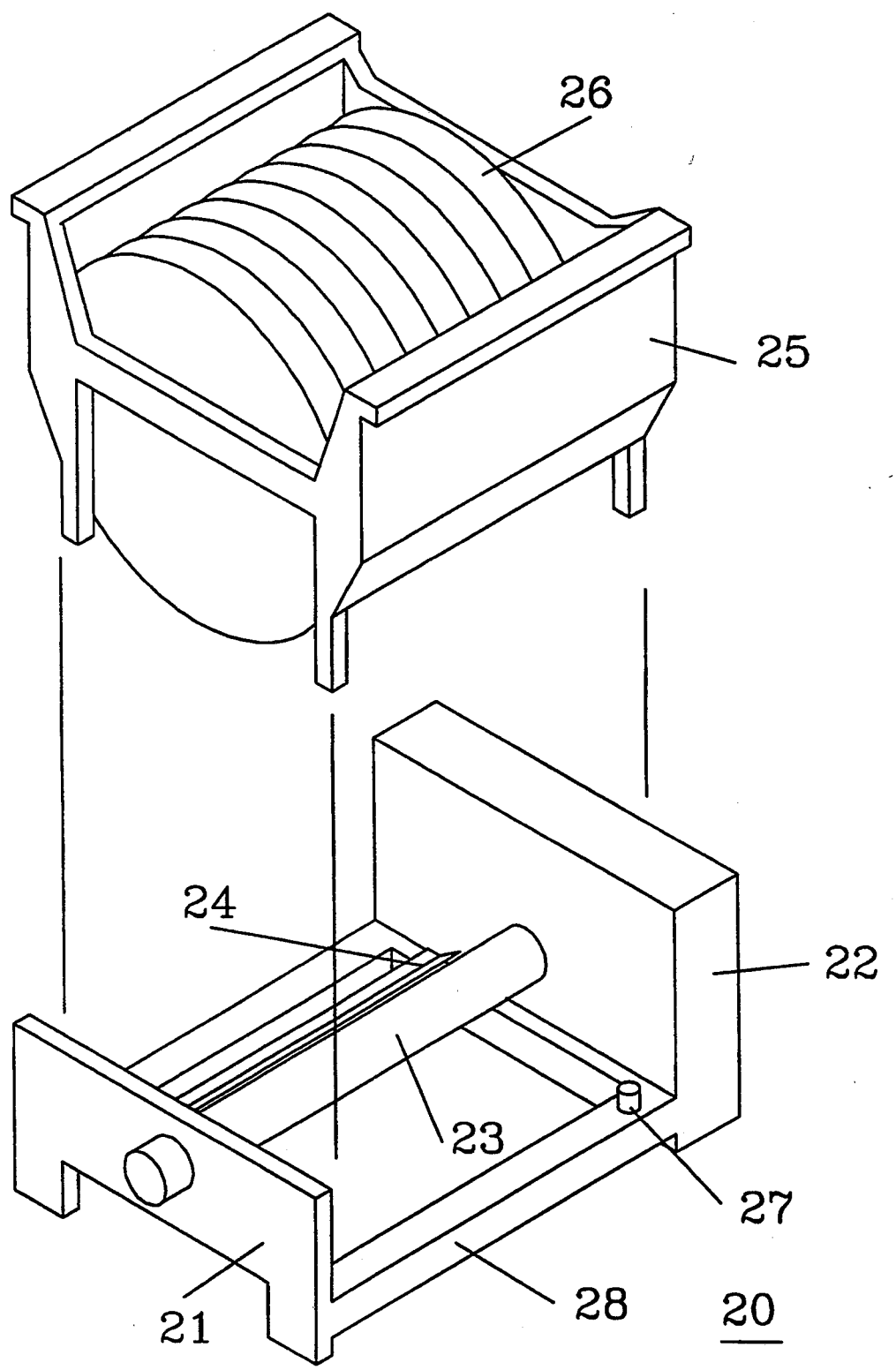
FIG. 3 illustrates an alignment apparatus, along with a wafer cassette, of the present invention.

A prior art wafer alignment apparatus is illustrated in FIGS. 1 and 2. To provide an understanding of the improvements of the present invention, a brief explanation of the prior art follows. In FIGS. 1 and 2 a wafer cassette 11, holding wafers 12, is mounted on an alignment apparatus having a frame 10, a roller 13 and an alignment plate 14. Roller 13 rotates, turning wafers 12 until the flat 12a is over the roller and the wafer stops rotating. When all of the wafers have stopped rotating, a sensor, for example a photo cell, determines that the flats 12a of all the wafers are aligned. The alignment plates 14 move up and down to square the wafers against the alignment plate. The wafers are then aligned in a flat down position. Alignment plates 14 are moved up and down by the movement of cam 15. The structure of the alignment plate 14 prevents laminar air flow upward or downward through the wafers.

FIG. 3 illustrates the apparatus of the present invention. Semiconductor wafer flat aligner 20 includes a frame 28 supported at one end by end plate 21 and the other end by housing 22. Housing 22 encloses the controller circuit and mechanical parts used in aligning wafers. Drive roller 23 is rotatably mounted in end plate 21 and extends into housing 22 where it is rotated by a motor. Alignment blade 24 is mounted at one side of roller 23. Switch 27 on frame 28 starts the alignment apparatus when cassette 25 is mounted on the alignment apparatus. Semiconductor wafers 26, in cassette 25, are freely rotatable in cassette 25.

Roller 23 may be as small as 9 millimeters. The size of roller 23 depends upon the diameter of the wafers being aligned. Roller 23 has a surface of a tacky polymer which provides traction on the wafers, eliminates slippage so there is no micro particle problem. The tacky surface helps remove particles from the edge of the wafers. Particle removal is usually accomplished in a clean room utilizing a paper sponge or similar material. The small size of roller 23 allows greater air flow through the wafers.

Alignment blade 24 is rotated so that the edge of the blade aligns the wafers by stopping the wafers at the leading edge 26a (FIG. 5) of the flat. The edge is then rotated downward to allow positioning of the flats at a desired position.

The position of the wafers is determined by the number of turns of roller 23, as opposed to the prior art method of using a photo sensor and alignment plates.

Figure 4:
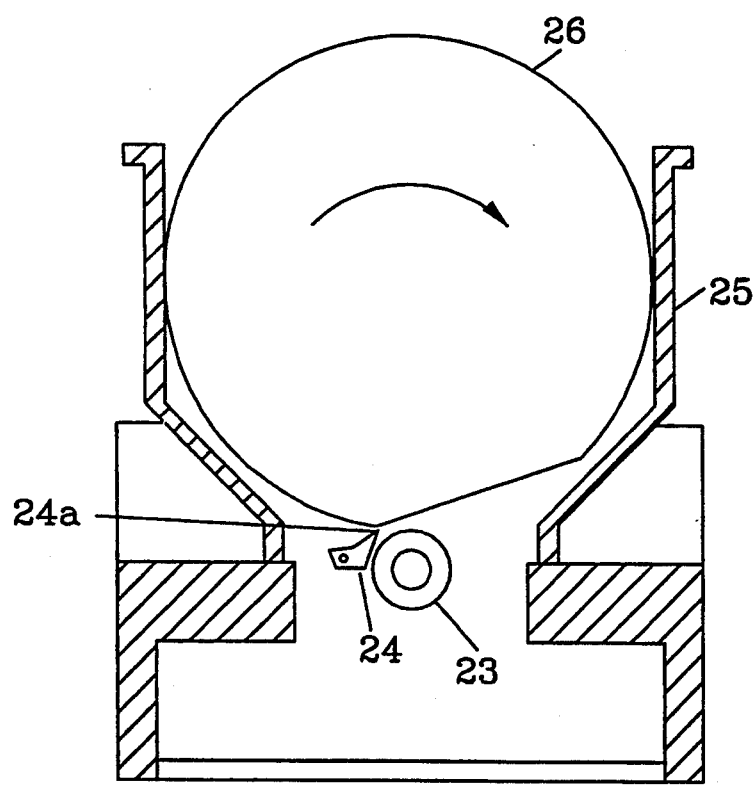
FIGS. 4 and 5 illustrate operation of the alignment apparatus of the present invention.
Figure 5:
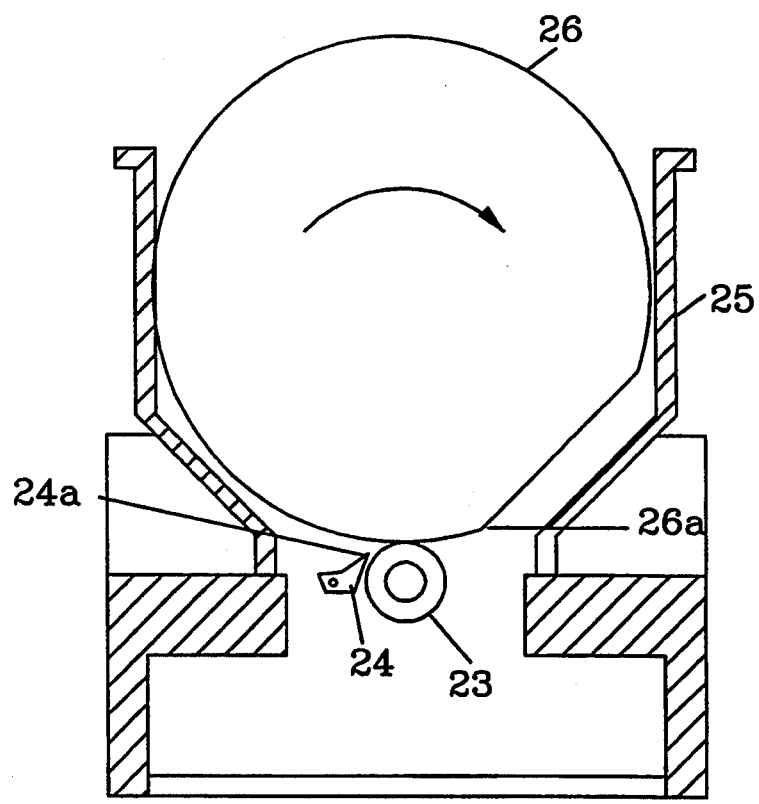

FIGS. 4 and 5 illustrate the alignment procedure. Roller 23 is turned to rotate wafers 26 clockwise until alignment blade 24 stops the wafers at the leading edge 26a of wafer 26 (FIG. 4). Roller 23 continues to turn until all the wafers have been stopped and aligned against blade 24. Alignment blade 24 is then rotated a small angle downward (FIG. 5) to allow the wafers to make contact with roller 23. Roller 23 is turned to position the flats to the desired position.

Figure 6:
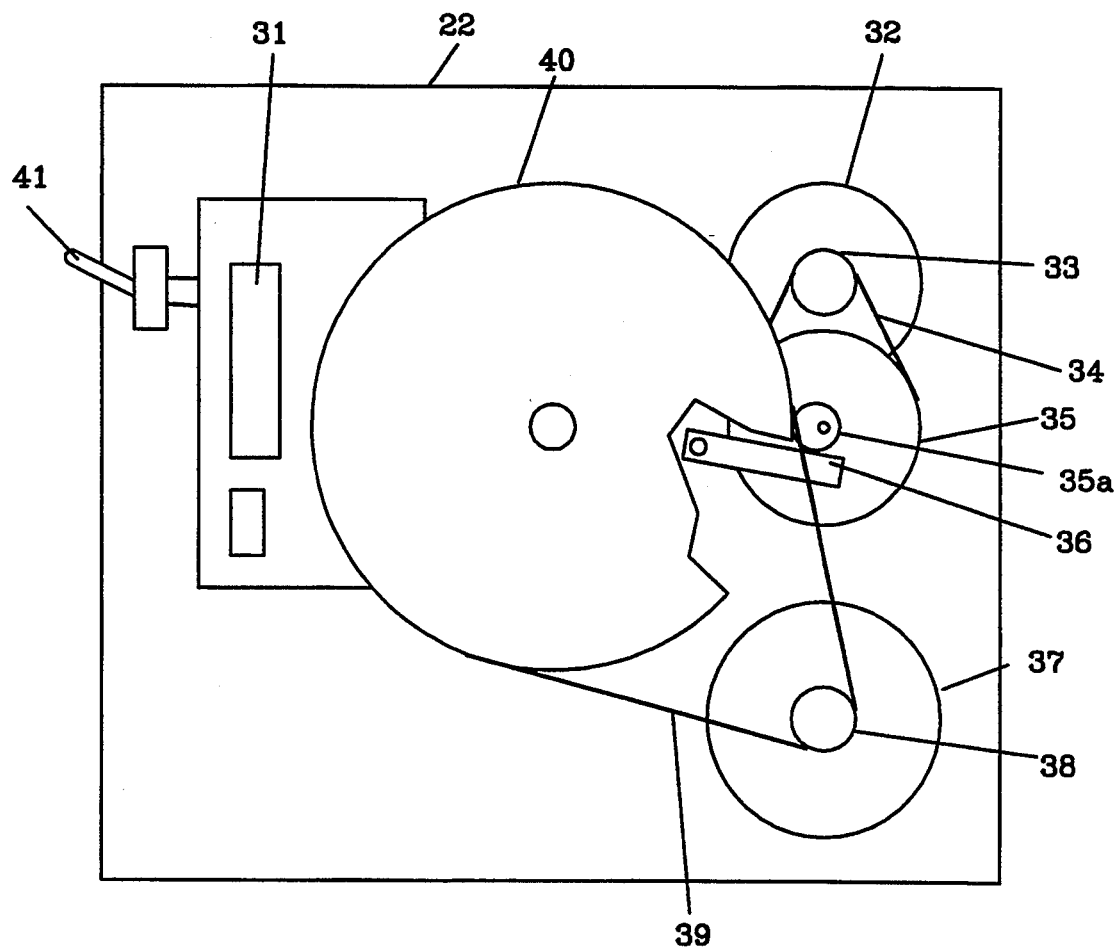
FIG. 6 shows the alignment control mechanism.

FIG. 6 shows the apparatus mechanism and the controls in the housing 22. In one embodiment, the alignment of the wafer flat edge is based on a fixed relationship between drive roller 23 diameter and the wafer diameter. Based upon the fixed relationship, the wafer flat position can be determined by counting the number of revolutions of roller 23. For the example described below, the roller/wafer ratios is that 16 revolutions of roller 23 rotates a wafer one revolution. Basic operation of wafer alignment is as follows.

The wafer cassette 25 with wafers 26 is placed on platform 28. Power actuator switch 27 is depressed by the wafer cassette 26 supplying power to controller 31, initiating the alignment program. The program is divided into phases, Phase I and Phase II. Phase one is as follows.

Alignment Phase I

After a short delay, for example one-half second, motor 32 is turned on, turning counter-clockwise for a short period, for example 0.2 second. Motor 32 turns pulley 33 and belt 34 which in turn rotates pulley 35. Mounted on pulley 35 is cam 35a. Riding on cam 35a is cam follower arm 36 which is attached to alignment blade 24 (FIG. 4). Alignment blade 24 is rotated upward as illustrated in FIG. 4. Motor 37 is turned on and power is transferred from motor 37 to pulley 40 via pulley 38 and belt 39. Roller 23 is attached to pulley 40.

Roller 23 is turned counter clockwise for two turns, rotating the wafers by one-eighth turn. Some of the wafers may have the alignment flat edge resting on top of alignment blade 24 instead of stopping the wafer with the flat edge by the alignment blade 24. In order to clear this problem, alignment blade 24 is lowered, as shown in FIG. 5, by reversing motor 32 and rotating cam follower arm 36. Roller 23 is rotated one revolution clockwise, rotating the wafers one-sixteenth a turn, clearing the wafer flat edge from resting on the alignment blade 24.

Alignment blade 24 is then rotated upward and roller 23 is rotated counter-clockwise for sixteen turns. This ensures that all of the wafers make a complete rotation and are stopped by alignment blade 24 at the edge 26a of the wafer flat.

Alignment Phase II

With the wafers positioned so that the flat edge 26a is positioned at the alignment blade 24, a logic check is performed by microprocessor 31. If switch 41 is in the Flat "up" position, alignment blade 24 is lowered and roller 23 is turned clockwise for seven turns which rotates the wafers counter-clockwise by 7/16 turns, positioning the wafer flat at the top.

If switch 41 is in the flat "down" position, alignment blade 24 is lowered, and roller 23 is turned clockwise for one turn which places the wafers with the aligned wafer flat edges downward.

An optional custom switch (not illustrated) may be set at a preprogrammed position to align the wafer flats at a position other than up or down. The programming will rotate roller 23 "N" turns to position the wafer flats at the desired position.

When flat alignment is completed, controller 31 enters an idle stage for a predetermined time interval. During the idle state, the flat position can be changed by moving the selector switch to reposition the wafer flats to a new desired position.

Figure 7:
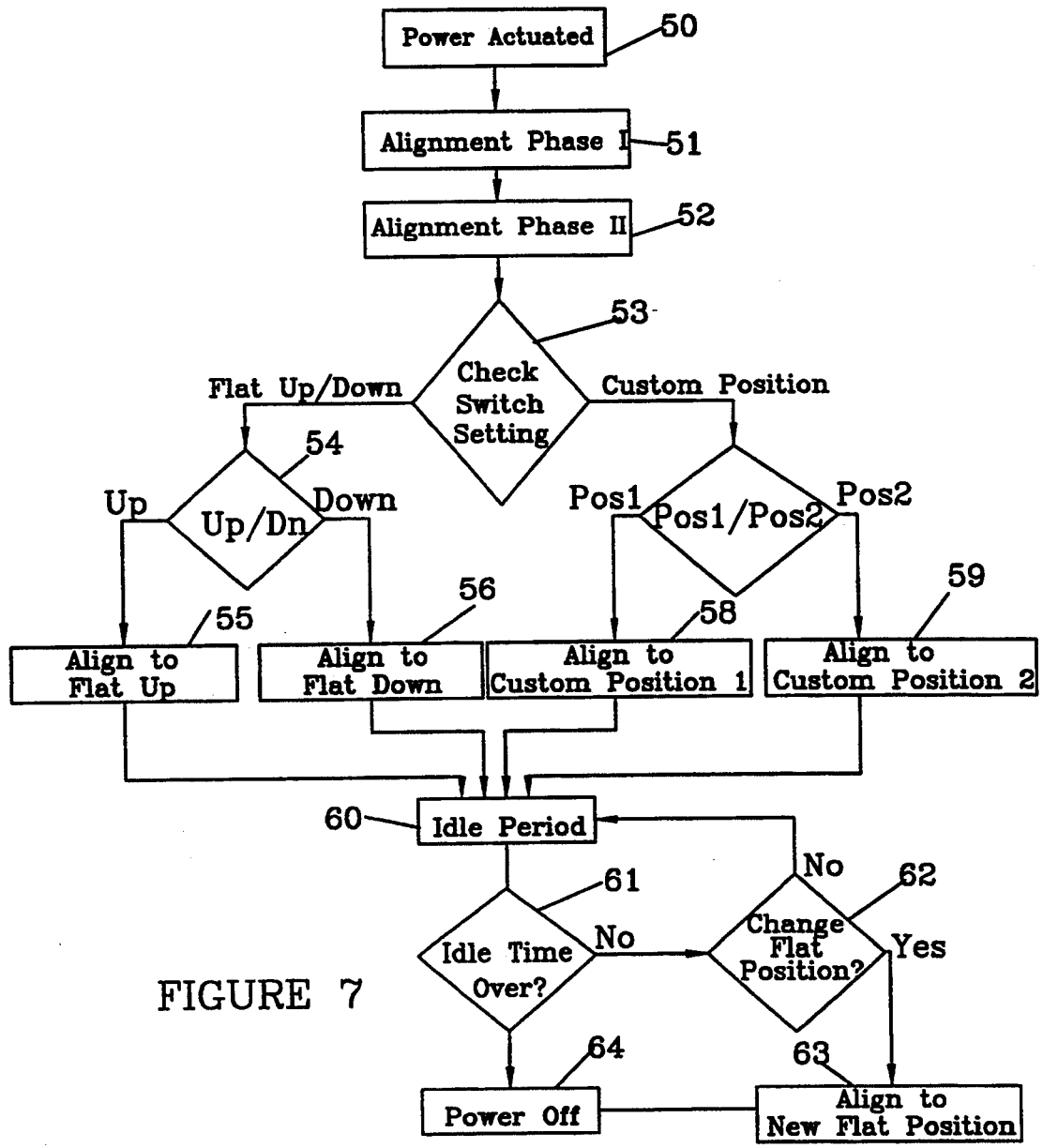
FIG. 7 show a process flow diagram of the method used in aligning the wafers.

The programming logic of the alignment procedure is illustrated in FIG. 7. After power on (50), alignment Phase I (51) and alignment Phase (52) are accomplished. The alignment position is then checked (53). If the flat is to be positioned "Up" or "Down" a determination of "Up" or "Down" is made (54). If "Up" has been selected, then the flats are aligned Flat Up (55). The idle period (60) is then entered. If the idle time expires (61), then power is turned Off (64). If a change in flat position is made during the idle time, a determination is made if the Flat position is to be changed (62). If a change is to be made, then the new alignment is made (63), and then power is turned Off (64). If there is no alignment change, then the idle period (60) is entered again.

If a custom position for the wafer flat is desired, the switch setting (53) is set at Custom Position. Next one of two custom positions Pos1 or Pos2 is selected (57). The procedure then is the same for either position, only the movement is different to move the aligned flats to the desired position. If custom Position Pos1 is selected, then the wafer flats are aligned to Position 1. The idle period (60) is then started. If the idle period (61) comes to an end with no change, then the power is turned Off. If there is an indication that the Wafer flat position is to be changed (62) before the end of the Idle Time, then the wafer flats are aligned to a new flat position (63), then the power is turned off. If there is no indication of a change of flat position, then another Idle Period starts. If not further change is desired, then the Idle time is allowed to pass and the power is turned Off.

What is claimed is:

1. An apparatus for aligning flat edges of semiconductor wafers mounted in a cassette, comprising:
   a base, including a housing, upon which the cassette is mounted;
   a longitudinally extending roller located under said cassette in rolling contact with wafers in said cassette; and
   a pivotally mounted alignment blade having its longitudinal axis extending parallel to said roller, said alignment blade being positioned adjacent said roller and when pivoted upward, engages said wafers at a point adjacent the flat edge of each wafer; stopping wafer rotation;
   whereby, when the alignment blade is pivoted downward and when said roller is rotated a predetermined number of revolutions, the flat edges of said wafers are aligned at a desired location.

2. The apparatus according to claim 1, including a switch actuated by the placing of the cassette on said base for initiating an alignment process.

3. The apparatus according to claim 1, including a first motor for providing the pivoting action of the alignment blade and a second motor for rotating the roller.

4. The apparatus according to claim 1, wherein said housing is at one end of said base, and said roller and alignment blade extend from said housing to an end of said base opposite the end where the housing is located.

5. The apparatus according to claim 1, wherein the pivotal action of the alignment blade is produced by a cam and a follower arm, the cam being rotated by a motor.

6. The apparatus according to claim 1, wherein the ratio of the diameter of the roller to the diameter of the wafer is 1 to 16.

7. The apparatus according to claim 1, wherein said roller is coated with a tacky polymer to prevent slipping of the wafers on the roller.

8. An apparatus for aligning flat edges of semiconductor wafers mounted in a cassette, comprising:
   a base, including a housing, upon which the cassette is mounted;
   a roller, driven by a first motor, extending the length of the base under said cassette in rolling contact with wafers in said cassette; and
   a pivotally mounted alignment blade, driven by a second motor, having its longitudinal axis extending parallel to said roller, said alignment blade, when pivoted upward, engaging said wafers at a point adjacent the flat edge of each wafer, stopping wafer rotation;
   whereby, when the alignment blade is pivoted downward and when said roller is rotated a predetermined number of revolutions, the flat edges of said wafers are aligned at a desired location.

9. The apparatus according to claim 8 including a switch actuated by the placing of the cassette on said base for initiating an alignment process.

10. The apparatus according to claim 8, wherein said housing is at one end of said base, and said roller and alignment blade extend from said housing to an end of said base opposite the end where the housing is located.

11. The apparatus according to claim 8, wherein the pivotal action of the alignment blade is produced by a cam and a follower arm, the cam being rotated by said second motor.

12. The apparatus according to claim 8, wherein the ratio of the diameter of the roller to the diameter of the wafer is 1 to 16.

13. The apparatus according to claim 8, wherein said roller is coated with a tacky polymer to prevent slipping of the wafers on the roller.

14. The apparatus according to claim 8, wherein the position of the wafer flat edges is determined by rotating the roller a predetermined number of revolutions for a desired position.

15. A method for aligning flat edges on semiconductor wafers in an apparatus having a roller and an alignment blade, including the steps of:
   rotating said wafers with a roller in a first direction to ensure that all flat edges are clear of the alignment blade,
   pivoting said alignment blade in an upward position;
   rotating the wafers in a second direction until the rotation of each wafer is stopped by said alignment blade engaging an edge of the flat edge, and said flat edges are aligned;
   rotating said alignment blade in a downward direction; and
   rotating said wafers in a direction to position the aligned flat edges of the wafers at a desired position.

16. The method according to claim 15, wherein the direction of rotation of said wafers to position the aligned flat edges of the wafers at said desired position depends upon the position of the flat edge, up or down.

17. The method according to claim 15, including the step of providing an idle period after aligning the wafer flat edges, to provide for changing the position of the aligned flat edges.

* * * * *